United States Patent
Chidambarrao et al.

(10) Patent No.: US 6,887,751 B2
(45) Date of Patent: May 3, 2005

(54) MOSFET PERFORMANCE IMPROVEMENT USING DEFORMATION IN SOI STRUCTURE

(75) Inventors: Dureseti Chidambarrao, Weston, CT (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,167

(22) Filed: Sep. 12, 2003

(65) Prior Publication Data

US 2005/0059201 A1 Mar. 17, 2005

(51) Int. Cl.[7] .......................................... H01L 21/8238
(52) U.S. Cl. ...................... 438/216; 438/153; 438/440
(58) Field of Search ................................ 438/153, 216, 438/225, 439, 440

(56) References Cited

U.S. PATENT DOCUMENTS

| | | |
|---|---|---|
| 3,602,841 A | 8/1971 | McGroddy |
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |

(Continued)

OTHER PUBLICATIONS

Kern Rim, et al., "Transconductance Enhancement in Deep Submicron Strained–Si n–MOSFETs", International Electron Devices Meeting, 26, 8, 1, IEEE, Sep. 1998.

(Continued)

*Primary Examiner*—Amir Zarabian
*Assistant Examiner*—Pamela E Perkins
(74) *Attorney, Agent, or Firm*—McGuireWoods LLP; Joseph P. Abate

(57) ABSTRACT

A method for manufacturing a semiconductor device is provided. The method includes forming a semiconductor layer on a substrate. The first region of the substrate is expanded to push up the first portion of the semiconductor layer, thereby applying tensile stress to the first portion. The second region of the substrate is compressed to pull down the second portion of the semiconductor layer, thereby applying compressive stress to the second portion. An N type device is formed over the first portion of the semiconductor layer, and a P type device is formed over the second portion of the semiconductor layer.

12 Claims, 4 Drawing Sheets

U.S. PATENT DOCUMENTS

| | | |
|---|---|---|
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 * | 5/2001 | Doyle et al. ............... 438/199 |
| 6,246,095 B1 | 6/2001 | Brady et al. |
| 6,255,169 B1 | 7/2001 | Li et al. |
| 6,261,876 B1 * | 7/2001 | Crowder et al. ............ 438/149 |
| 6,261,964 B1 | 7/2001 | Wu et al. |
| 6,274,444 B1 | 8/2001 | Wang |
| 6,281,532 B1 | 8/2001 | Doyle et al. |
| 6,284,626 B1 | 9/2001 | Kim |
| 6,361,885 B1 | 3/2002 | Chou |
| 6,362,082 B1 | 3/2002 | Doyle et al. |
| 6,368,931 B1 | 4/2002 | Kuhn et al. |
| 6,403,975 B1 | 6/2002 | Brunner et al. |
| 6,406,973 B1 | 6/2002 | Lee |
| 6,476,462 B2 | 11/2002 | Shimizu et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 2002/0074598 A1 | 6/2002 | Doyle et al. |
| 2002/0086472 A1 | 7/2002 | Roberds et al. |
| 2002/0090791 A1 | 7/2002 | Doyle et al. |
| 2003/0040158 A1 | 2/2003 | Saitoh |

OTHER PUBLICATIONS

Kern Rim, et al., "Characteristics and Device Design of Sub–100 nm Strained Si N– and PMOSFETs", 2002 Symposium On VLSI Technology Digest of Technial Papers, IEEE, pp 98–99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High–Performance 130nm node CMOS Technology for Large Scale System–on–a–Chip Application", International Electron Devices Meetings, 23.5.1, IEEE, Apr. 2000.

Shinya Ito, et al., "Mechanical Stress Effect of Etch–Stop Nitride and its Impact on Deep Submicron Transistor Design", International Electron Devices Meeting, 10.7.1, IEEE, Apr. 2000.

A. Shimizu, et al., "Local Mechanical–Stress Control (LMC): A New Technique for CMOS–Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

\* cited by examiner

NMOS | PMOS

MOSFET PERFORMANCE IMPROVEMENT USING DEFORMATION IN SOI STRUCTURE

BACKGROUND OF INVENTION

The invention generally relates to methods for manufacturing a semiconductor device with improved device performance, and more particularly to methods for manufacturing semiconductor devices by imposing tensile and compressive stresses in the substrate.

Mechanical stresses (e.g., tensile stress and compressive stress) within a semiconductor substrate can modulate device performance, which means stresses within a semiconductor substrate enhance semiconductor device characteristics. Thus, the characteristics of a semiconductor device can be improved by creating tensile and/or compressive stresses in the channel regions of an N type device (e.g., NFET) and/or a P type device (e.g., PFET). However, the same stress component, either tensile or compressive stress, discriminatively affects the characteristics of an N type device and a P type device. For example, when tensile stress is applied to a device in the direction of current flow, the performance of an N type device is enhanced but the performance of a P type device is degraded. Thus, in order to maximize the performance of both N type and P type devices formed on the same semiconductor substrate, each stress component should be selectively engineered and applied to either NFETs or PFETs.

To selectively create tensile stress to an N type device and compressive stress to a P type device, respectively, distinctive processes and different combinations of materials are used. For example, a trench isolation structure can be used in forming N type and P type devices. When the trench isolation structure is formed, an isolation region for the N type device contains the isolation material which applies appropriate stress to the N type device in a longitudinal direction and in a transverse direction. Further, the first isolation region and the second isolation region are provided for the P type, which apply a unique mechanical stress on the P type device in the longitudinal direction.

Alternatively, liners can be formed on the side surfaces of a gate electrode, to selectively induce appropriate stress types in the channels of the N type or P type devices. By providing liners, it is possible to apply appropriate stress closer to the device than relying on the trench isolation fill technique.

While these methods enables selectively applying tensile stress to the N type device and compressive stress to the PFET device along the longitudinal direction, they require more complicated processing steps and specific materials, thereby increasing manufacturing costs. Further, only a moderate amount of stress is obtained, such as only in the order of hundreds of MPa.

Therefore, there is a need for more cost-effective and cost-effective methodology for creating larger amount s of tensile and compressive stresses for both N type and P type devices without departing from readily available processing techniques.

SUMMARY OF INVENTION

In an aspect of the invention, a method for manufacturing a semiconductor device is provided. The method includes forming a semiconductor layer on a substrate. The first region of the substrate is expanded to push up the first portion of the semiconductor layer. The second region of the substrate is shrunk or compressed to pull down the second portion of the semiconductor layer. An N type device is formed over the first portion of the semiconductor layer. A P type device is formed over the second portion of the semiconductor layer.

In another aspect of the invention, a method of manufacturing a semiconductor device is provided. A semiconductor layer is formed on a substrate. An expansion element is selectively ion-implanted in the first region of the substrate. A compression element is selectively ion-implanted in the second region of the substrate. Annealing is performed to expand the first region and to shrink or compress the second region. The expanded first portion pushes up the first portion of the semiconductor layer and the compressed second portion pulls down the second portion of the semiconductor layer. An N type device is formed on the first portion of the semiconductor layer. A P type device is formed on the second portion of the semiconductor layer.

Yet another aspect of the invention is a semiconductor having a substrate comprising an expanded region and a compressed region. A semiconductor layer is formed on the substrate and have the first portion pushed up by the expanded region and the second portion pulled down by the compressed region. An N type device is formed on the first portion, and a P type device formed on the second portion.

DETAILED DESCRIPTION

The invention introduces a method for increasing device performances for both an N type device and a P type device, which is easily integrated into conventional processing steps without significantly increasing manufacturing costs. This is achieved by selectively introducing tensile and compressive strains in portions of a semiconductor substrate or layer on which an N type device and a P type device are formed. In general, the tensile strain is introduced by expanding a portion of the substrate or layer for the N type device, and the compressive strain is introduced by compressing a portion of the substrate or layer for the P type device.

Figure 1:
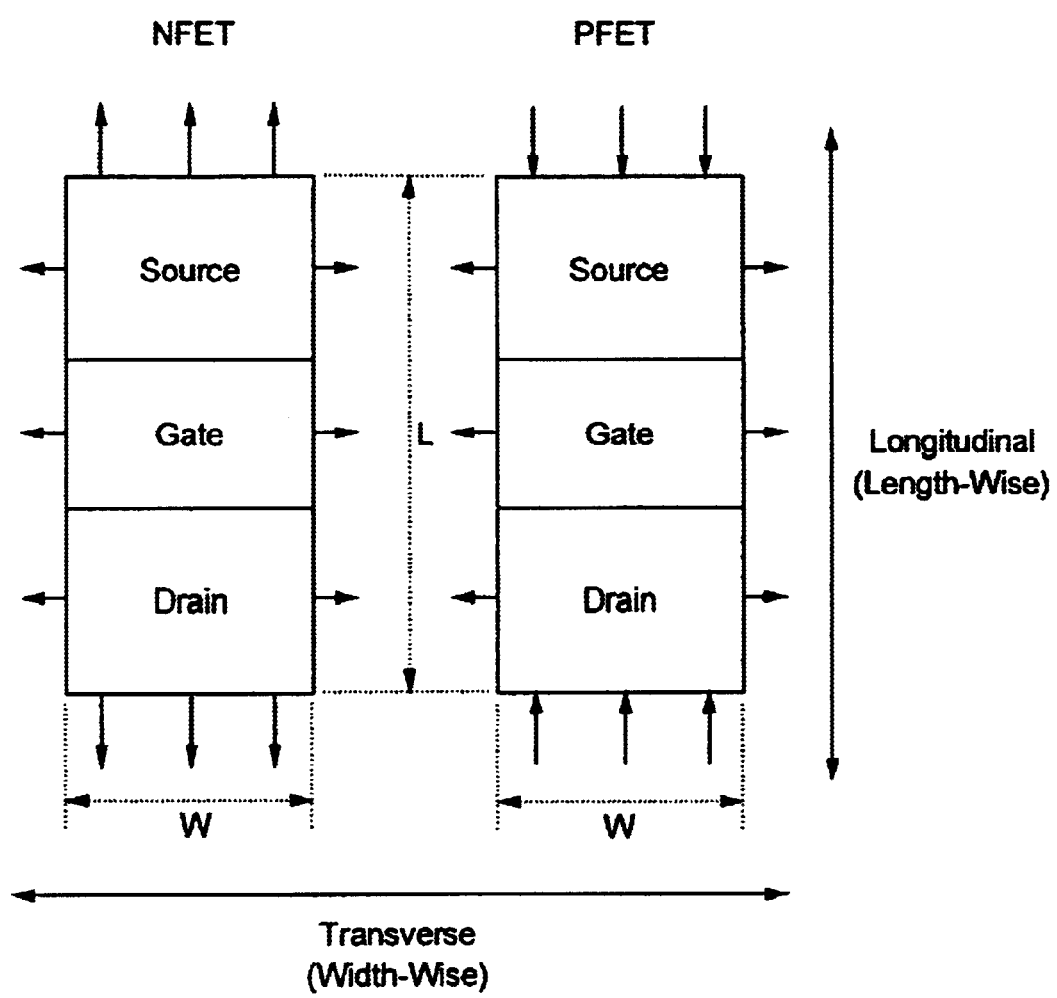
FIG. 1 depicts desired tensile and compressive stress for an N type device and a P type device, respectively.

FIG. 1 illustrates desired stress types for improving the performance of an N type device (e.g., NFET) and a P type device (e.g., PFET). Each of the NFET and PFET has a source region, a gate region and a drain region, as shown therein. The arrows extending outwardly from the active area illustrate tensile stress, and the arrows extending inwardly towards the PFET device illustrate compressive stress. The arrows outwardly extending from the NFET in both the transverse and longitudinal directions illustrate tensile stress desirable for the NFET. Similarly, the arrows extending inwardly towards the PFET in the longitudinal direction illustrates compressive stress desirable for the PFET. The range of stresses needed to influence device drive currents is of the order of a few hundred MPa to a few GPa. The width and the length of the active area of each device is represented by "W" and "L", respectively.

Figure 2:
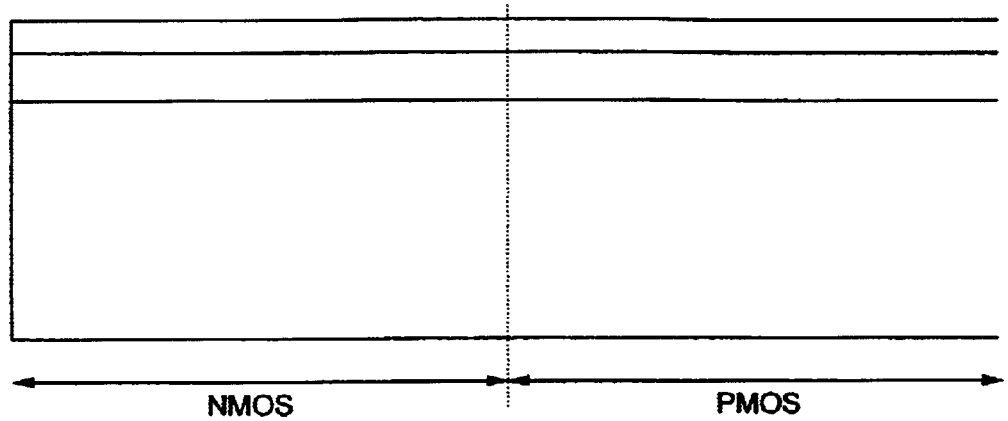
FIGS. 2 to 7 depict sequential phases of the method according to an embodiment of the invention.

FIG. 2 shows a substrate structure that is divided into an NMOS region and a PMOS region for illustration purposes.

Figure 3:
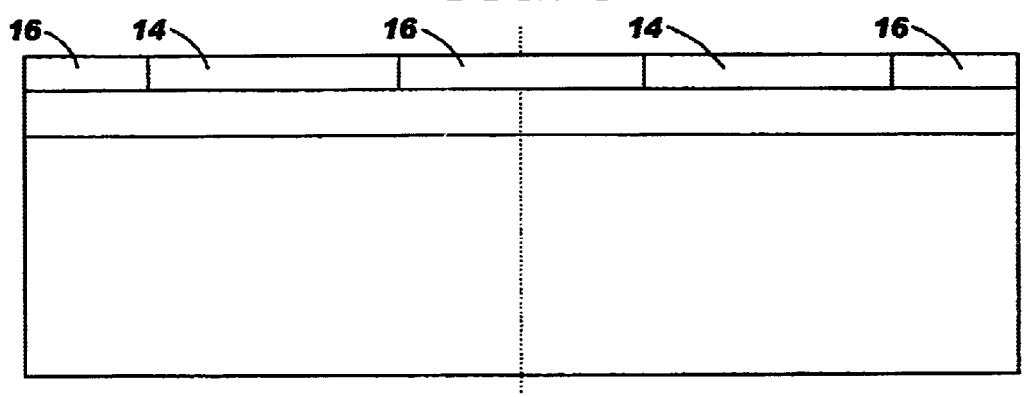

Particularly shown is a silicon-on-insulation (SOI) type substrate structure. The substrate structure has a semiconductor substrate 10, which is typically a silicon substrate, a buried oxide layer 12 formed on the substrate 10, and a semiconductor layer 14, which is typically a silicon layer, formed on the buried oxide layer 12. Subsequently, as shown in FIG. 3, shallow trench isolation (STI) regions 16 are formed in portions of the semiconductor layer 14 to isolate individual device regions from each other.

Figure 4:
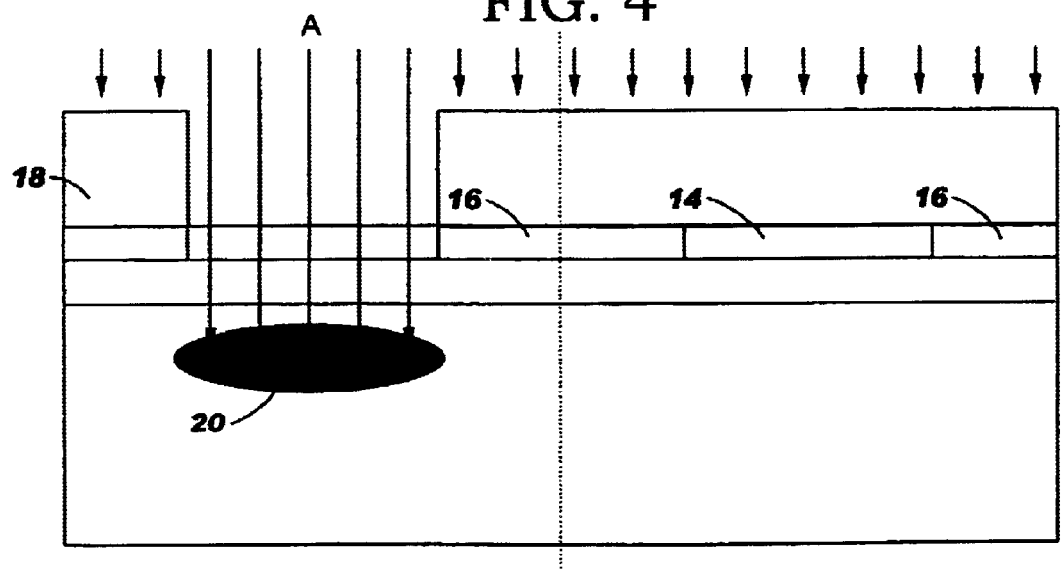

As shown in FIG. 4, the first mask layer 18 is formed on the substrate structure to selectively expose the device region of the NMOS region while masking the PMOS region. Subsequently, an expansion element (e.g., $O_2$) is ion-implanted, as shown by arrows "A", onto the exposed surface portion of the semiconductor layer 14 in the NMOS region. The ion-implantation is controllably performed such that the implanted expansion element forms the first region 20 in a portion of the substrate 10 underlying the exposed surface portion. Also, the concentration peak of the implanted expansion element is confined within the first region 20. In an embodiment, the expansion element is ion-implanted at an implantation concentration of approximately $1 \times 10^{14}$ atoms/cm$^2$ to $5 \times 10^{16}$ atoms/cm$^2$ and at an implantation energy of approximately 3:0 KeV to 300 KeV.

Figure 5:
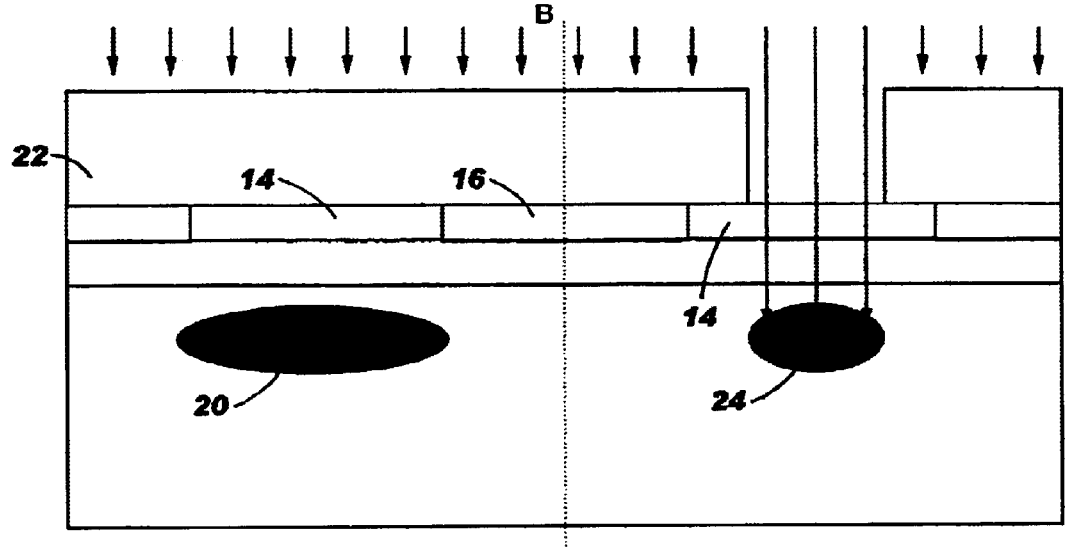

After removing the first mask 18 from the substrate structure, as shown in FIG. 5, the second mask 22 is formed thereon to selectively expose the device region of the PMOS region while masking the NMOS region. Subsequently, as shown by arrows "B", a compression element (e.g., He, Ar or other noble gas) is ion-implanted, onto the exposed surface portion of the semiconductor layer 14 in the PMOS region.

The ion-implantation process is controllably performed such that the implanted compression element forms a second region 24 in a portion of the substrate underlying the exposed surface portion. Also, the concentration peak of the implanted compression element is confined within the second region 24. In an embodiment, the compression element is ion-implanted at an implantation concentration of approximately $1 \times 10^{14}$ atoms/cm$^2$ to $5 \times 10^{16}$ atoms/cm$^2$ and at an implantation energy of approximately 30 KeV to 300 KeV.

Figure 6:
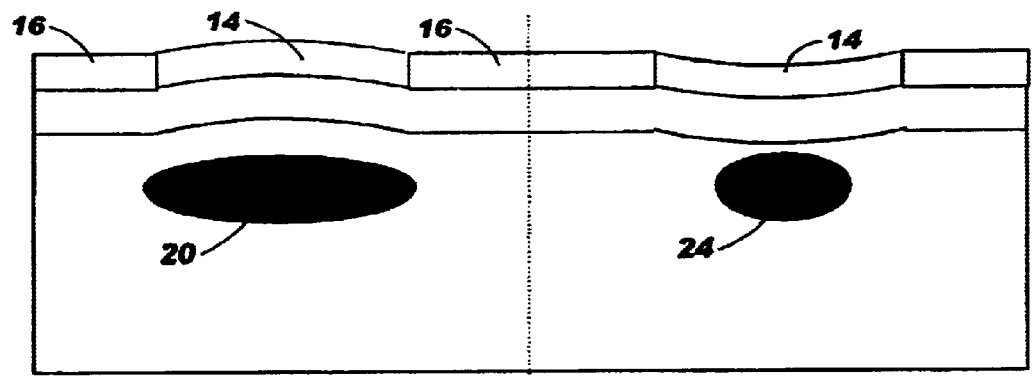

Upon forming the first region 20 containing the expansion element and the second region 24 containing the compression element, annealing is performed to activate the implanted expansion element and the compression element. As shown in FIG. 6, when annealing is performed, the first region 20 is activated and the expansion element expands the area that was previously occupied by the first region. This occurs through internal oxidation when the implanted $O_2$ reacts with the silicon and converts to silicon dioxide with its associated volume expansion. This expansion pushes up the portions of the oxide layer 12 and the semiconductor layer 14 overlying the expanded area, thereby increasing tensile stress in the surface portion of the semiconductor layer 14 overlying the expended area.

Also, upon annealing, the second region 24 is activated and the compression element shrinks the area which was previously occupied by the second region. This compression pulls down the portions of the oxide layer 12 and the semiconductor layer 14 overlying the compressed area, thereby increasing compressive stress in the surface portion of the semiconductor layer 14 overlying the compressed area. The respective arrows shown in FIG. 6 illustrate the regions 22 and 24 being expanding and compressed upon annealing.

Figure 7:
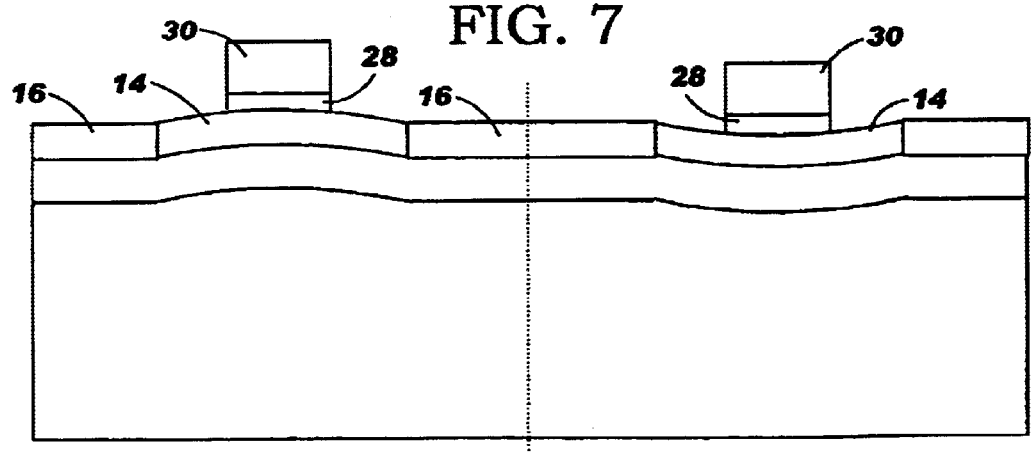

FIG. 7 shows gate electrodes 30 formed on the semiconductor layer 14 with a gate oxide layer 28 therebetween in the NMOS area and the PMOS area. Although it is not shown here, further processing steps would include forming N type source and drain regions in the NMOS area to constitute an N type device and P type source and drain regions in the PMOS area to constitute a P type device. Since the N type device is formed on the portion of the semiconductor layer 14 that has tensile strain, the performance of the N type device is significantly improved. Also, due to the compressive strain the performance of the P type device is significantly improved.

Figure 8:
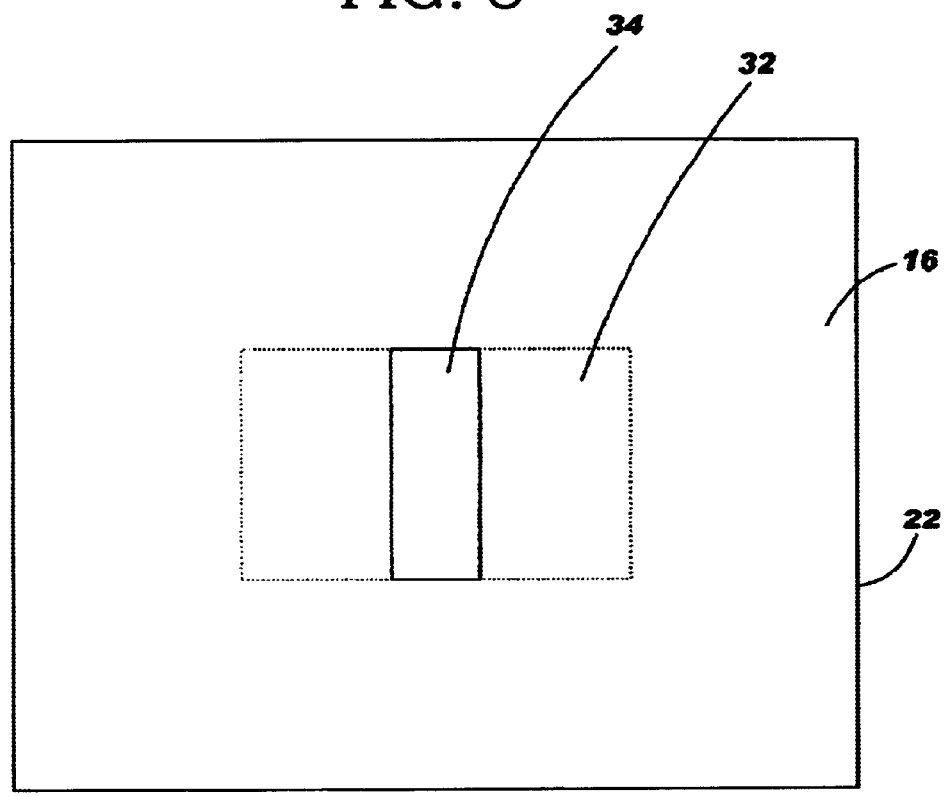
FIG. 8 depicts a top view of a semiconductor device shown in FIG. 3 after the first mask is removed and the second mask is formed thereon to expose a PMOS region according to an embodiment of the invention.

FIG. 8 shows a top view of the substrate structure shown in FIG. 4 prior to ion-implanting the compression element in the PMOS region. The dotted line shows an interface between a device region 32 and the STI region 16 surrounding the device region 32. The second mask 22 covers not only the STI region 16 but also portions of the device region 32 except for a center portion 34 of the device region expected to be a channel region for a PMOS device to be formed.

Thus, according to an embodiment of the invention, the compression element is ion-implanted to an area of the PMOS device region 32 which is smaller than that of the NMOS device region because the strain needed in the PMOS region is preferably only longitudinally compressive as seen in FIG. 1.

As explained above, the invention enables improving device performance of both an N type device and a P type device by selectively applying tensile stain in the active area, on which an N type device is formed and selectively applying compressive strain in the active region, on which a P type device is formed.

The tensile strain is created by expanding a portion of the substrate underlying the N type device. The expanded portion of the substrate pushes up the buried oxide layer and the silicon layer, thereby creating tensile stress to the active region of the silicon layer in the NMOS area. The compressed portion of the substrate pulls down a portion of the substrate underlying the P type device, thereby creating compressive stress to the active region of the silicon layer in the PMOS area.

The selective application of tensile strain and compressive strain is obtained by using readily available processing steps. Especially, since only two additional photolithography steps are required for the masking steps, the invention achieves significant improvement in device performance without significant increase in manufacturing costs.

While the invention has been described in terms of embodiments, those skilled in the art will recognize that the invention can be practiced with modification within the spirit and scope of the appended claims.

What is claimed is:

1. A method for manufacturing a semiconductor device, comprising steps of:

forming a semiconductor layer on a substrate;

expanding a first region of the substrate to push up a first portion of the semiconductor layer, including ion-implanting an expansion element in the first region of the substrate;

compressing a second region of the substrate to pull down a second portion of the semiconductor layer, including ion-implanting a compression element in the second region of the substrate;

forming an N type device over the first portion of the semiconductor layer; and forming a P type device over the second portion of the semiconductor layer.

2. The method of claim 1, wherein the compression element is ion-implanted at an implantation concentration of approximately $1 \times 10^{14}$ atoms/cm2 to $5 \times 10^{16}$ atoms/cm2 and at an implantation energy of approximately 30 KeV to 300 KeV.

3. The method of claim 1, wherein a concentration peak of the implanted compression element is confined within the second region.

4. The method of claim 1, wherein the compression element is He, Ar or noble gas.

5. The method of claim 1, wherein the step of ion-implanting the compression element comprise a step of masking to selectively expose a channel region of the P type device.

6. The method of claim 1, further comprising a step of annealing to expand the first region and to compress the second region.

7. The method of claim 6, wherein the step of annealing is performed at a temperature of approximately 500° C. to 1200° C. for approximately 1 second to 30 minutes.

8. A method of manufacturing a semiconductor device, comprising steps of:

forming a semiconductor layer on a substrate;

selectively ion-implanting an expansion element in a first region of the substrate;

selectively ion-implanting a compression element in a second region of the substrate;

annealing to expand the first region and to compress the second region, wherein the expanded first region pushes up a first portion of the semiconductor layer and the compressed second region pulls down a second portion of the semiconductor layer; and forming an N type device on the first portion of the semiconductor layer; and forming a P type device on the second portion of the semiconductor layer.

9. The method of claim 8, wherein the expansion element is $O_2$ and the compression element is He, Ar or noble gas.

10. The method of claim 8, wherein the expansion element is ion-implanted at an implantation concentration of approximately $1 \times 10^{14}$ atoms/cm$^2$ to $5 \times 10^{16}$ atoms/cm$^2$ and at an implantation energy of approximately 30 KeV to 300 KeV.

11. The method of claim 8, wherein the compression element is ion-implanted at an implantation concentration of approximately $1 \times 10^{14}$ atoms/cm$^2$ to $5 \times 10^{16}$ atoms/cm$^2$ and at an implantation energy of approximately 30 KeV to 300 KeV.

12. The method of claim 8, wherein the step of annealing is performed at a temperature of approximately 500° C. to 1200° C. for approximately 1 second to 30 minutes.

* * * * *